(12) United States Patent
Cai et al.

(10) Patent No.: US 11,839,166 B2
(45) Date of Patent: Dec. 5, 2023

(54) RRAM DEVICES AND METHODS OF FORMING RRAM DEVICES

(71) Applicant: GLOBALFOUNDRIES Singapore Pte. Ltd., Singapore (SG)

(72) Inventors: Xinshu Cai, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 512 days.

(21) Appl. No.: 16/840,471

(22) Filed: Apr. 6, 2020

(65) Prior Publication Data

US 2021/0313512 A1    Oct. 7, 2021

(51) Int. Cl.
*H10N 70/00* (2023.01)
*H10B 63/00* (2023.01)

(52) U.S. Cl.
CPC .......... *H10N 70/841* (2023.02); *H10B 63/84* (2023.02); *H10N 70/023* (2023.02); *H10N 70/063* (2023.02)

(58) Field of Classification Search
None
See application file for complete search history.

(56) References Cited

U.S. PATENT DOCUMENTS

| | | | | |
|---|---|---|---|---|
| 2012/0306090 A1* | 12/2012 | Smith | ............... | H01L 27/11556 257/773 |
| 2017/0229174 A1* | 8/2017 | Or-Bach | ............. | H01L 27/2436 |
| 2021/0134736 A1* | 5/2021 | Jhothiraman | ....... | H01L 23/5226 |

OTHER PUBLICATIONS

Wei et al., "Highly Reliable TaOx ReRAM and Direct Evidence of Redox Reaction Mechanism", 2008 IEEE International Electron Devices Meeting, 2008, 4 pages, IEEE.
Chen et al., "Variability of Resistive Switching Memories and Its Impact on Crossbar Array Performance", 2011 International Reliability Physics Symposium, 2011, 4 pages, IEEE.
Chen et al., "HfOx Based Vertical Resistive Random Access Memory for Cost-Effective 3D Cross-Point Architecture without Cell Selector", 2012 International Electron Devices Meeting, 2012, 4 pages, IEEE.
Hsu et al., "3D Vertical TaOx/TiO2 RRAM with over 103 Self-Rectifying Ratio and Sub-µA Operating Current", 2013 IEEE International Electron Devices Meeting, 2013, 4 pages, IEEE.
Parat et al., "A Floating Gate Based 3D NAND Technology With CMOS Under Array", 2015 IEEE International Electron Devices Meeting (IEDM), 2015, 4 pages, IEEE.

(Continued)

*Primary Examiner* — Mounir S Amer
(74) *Attorney, Agent, or Firm* — VIERING JENTSCHURA & PARTNER MBB

(57) ABSTRACT

A resistive random access memory (RRAM) device may be provided, including: a base layer, a vertical electrode stack arranged over the base layer, where the vertical electrode stack may include alternating mask elements and first electrodes, and each first electrode may include an extended portion extending beyond at least one side surface of at least one mask element adjoining the first electrode, a switching layer arranged along the extended portion of each first electrode and along the at least one side surface of the at least one mask element adjoining the first electrode, and a second electrode including a surface in contact with the switching layer. The RRAM device may have a 3D structure.

20 Claims, 8 Drawing Sheets

(56) References Cited

OTHER PUBLICATIONS

Nakayama, "ReRAM technologies: Applications and outlook", 2017 IEEE International Memory Workshop (IMW), 2017, 4 pages, IEEE.

Chuang et al., "Effects of Electric Fields on the Switching Properties Improvements of RRAM Device With a Field-Enhanced Elevated-Film-Stack Structure", IEEE Journal of the Electron Devices Society, May 2, 2018, pp. 622-626, vol. 6, IEEE.

\* cited by examiner

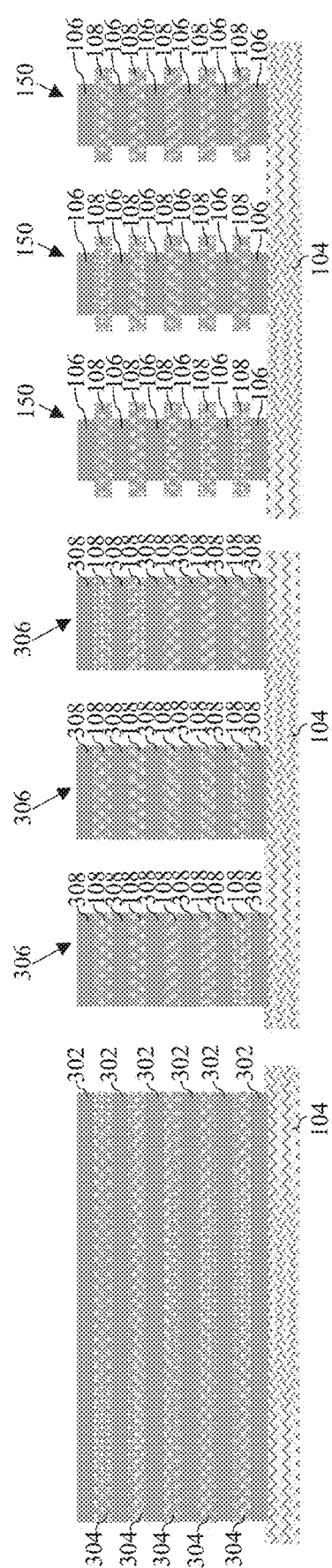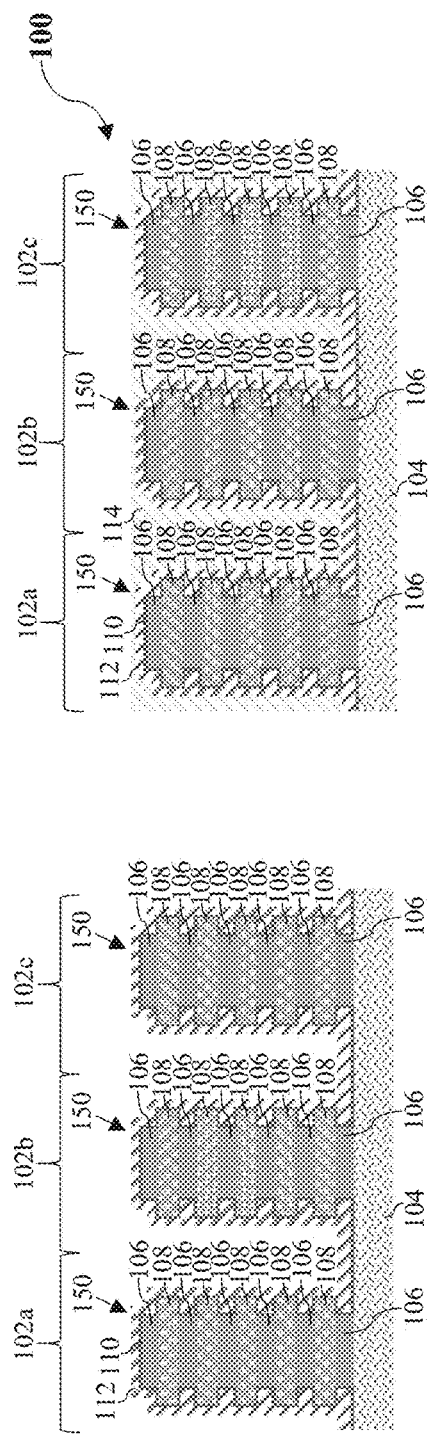

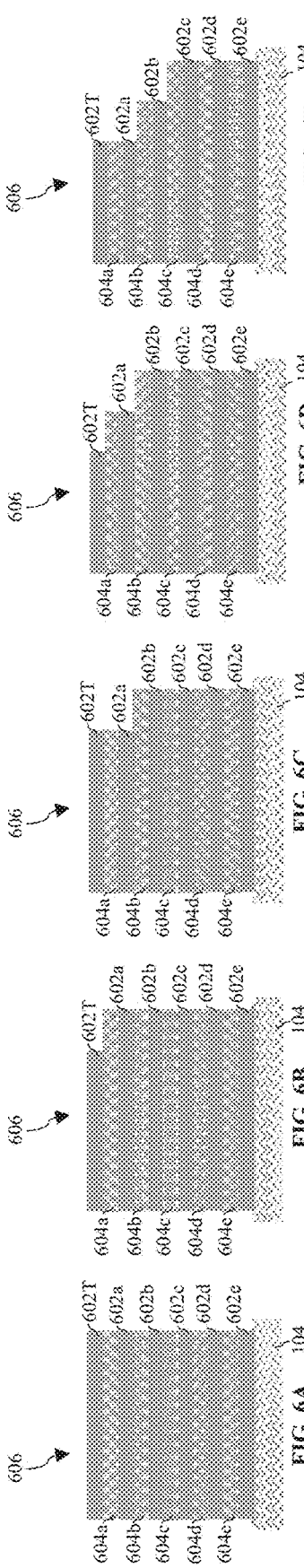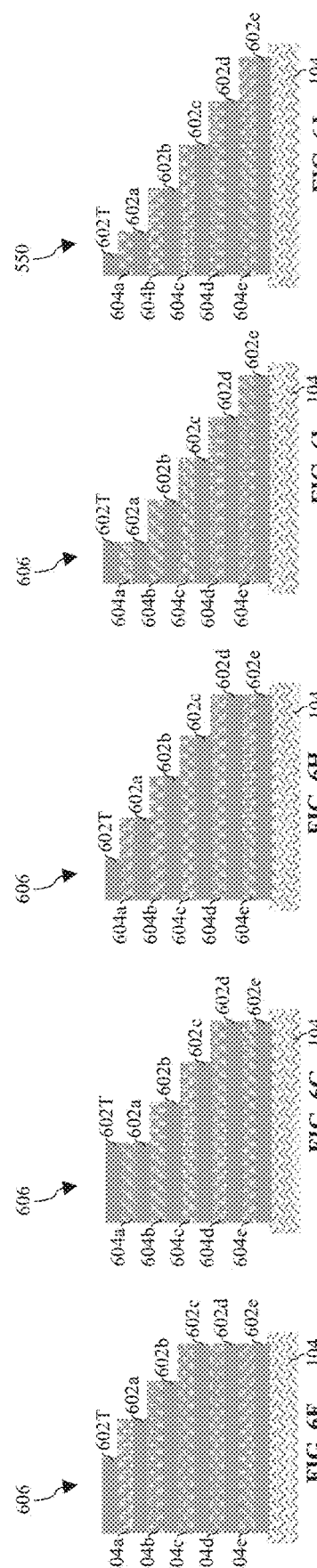

RRAM DEVICES AND METHODS OF FORMING RRAM DEVICES

TECHNICAL FIELD

The present disclosure relates generally to resistive random access memory (RRAM) devices, and methods of forming the RRAM devices.

BACKGROUND

Non-volatile memory devices are often used in consumer electronic products such as smart phones and tablets. One type of non-volatile memory device is the RRAM device. A RRAM device typically uses a switching layer such as a dielectric layer sandwiched between two electrodes. The switching layer is normally insulating. However, upon application of a sufficiently high potential difference (set voltage) between the electrodes, a dielectric breakdown event can occur and conducting filaments may be formed within the switching layer between the electrodes. The switching layer thus becomes conductive via the conducting filaments. The switching layer can be made insulating again by applying a sufficiently low voltage difference (reset voltage) to the electrodes to break the conducting filaments. A typical RRAM device can switch between states based on the resistance of the switching layer. When the switching layer is insulating, the switching layer has a high resistance, and the RRAM device may be referred to as being in a high resistance state (HRS). When the switching layer is conductive, the switching layer has a low resistance and the RRAM device may be referred to as being in a low resistance state (LRS). To set the RRAM device, the RRAM device is switched from the HRS to the LRS. To reset the RRAM device, the RRAM device is switched from the LRS to the HRS.

There are many types of RRAM devices, for example, the oxygen-vacancy RRAM (OxRAM) devices and the conductive bridge RRAM (CBRAM) devices. In general, the OxRAM devices differ from the CBRAM devices in the composition of the conducting filaments. In particular, in an OxRAM device, the conducting filaments usually include oxygen vacancies; whereas, in a CBRAM device, the conducting filaments usually include metal formed from the dissolution of one of the electrodes.

Conducting filaments are often formed at random across many locations within the switching layer. In addition, incomplete rupture of the switching layer may occasionally occur, causing conducting filaments of varying sizes to be formed across the switching layer. Further, the size of each conducting filament can be large, for example, each conducting filament may be a few atoms in size. These can cause the resistance of the switching layer (and hence, the RRAM device) to vary greatly across multiple dielectric breakdown events. In particular, the resistance of the switching layer when the RRAM device is in the HRS tends to vary greatly over different cycles. This can lead to high device-to-device variability and cycle-to-cycle variability. Accordingly, the resistances of the RRAM devices in an RRAM structure can vary greatly between each other and between different breakdown events.

Therefore, it is desirable to provide an improved memory device having reduced variability in its resistance.

SUMMARY

According to various non-limiting embodiments, there may be provided a RRAM device including: a base layer; a vertical electrode stack arranged over the base layer, wherein the vertical electrode stack may include alternating mask elements and first electrodes, and each first electrode may include an extended portion extending beyond at least one side surface of at least one mask element adjoining the first electrode; a switching layer arranged along the extended portion of each first electrode and along the at least one side surface of the at least one mask element adjoining the first electrode; and a second electrode including a surface in contact with the switching layer.

According to various non-limiting embodiments, there may be provided a method of forming a RRAM device including: providing a base layer; forming a vertical electrode stack over the base layer, wherein the vertical electrode stack may include alternating mask elements and first electrodes, and each first electrode may include an extended portion extending beyond at least one side surface of at least one mask element adjoining the first electrode; forming a switching layer along the extended portion of each first electrode and along the at least one side surface of the at least one mask element adjoining the first electrode; and forming a second electrode including a surface in contact with the switching layer.

According to various non-limiting embodiments, there may be provided a three-dimensional (3D) RRAM structure including a matrix of RRAM devices. Each RRAM device may include a base layer; a vertical electrode stack arranged over the base layer, where the vertical electrode stack may include alternating mask elements and first electrodes, and each first electrode may include an extended portion extending beyond at least one side surface of at least one mask element adjoining the first electrode; a switching layer arranged along the extended portion of each first electrode and along the at least one side surface of the at least one mask element adjoining the first electrode; and a second electrode including a surface in contact with the switching layer.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which:

FIGS. 3A to 3E show simplified cross-sectional views that illustrate a method for fabricating the RRAM structure of FIGS. 1A and 1B according to various non-limiting embodiments;

FIGS. 6A to 6J show simplified cross-sectional views that illustrate a method for fabricating a vertical electrode stack of the RRAM structure of FIG. 5.

DETAILED DESCRIPTION

Figure 1A:
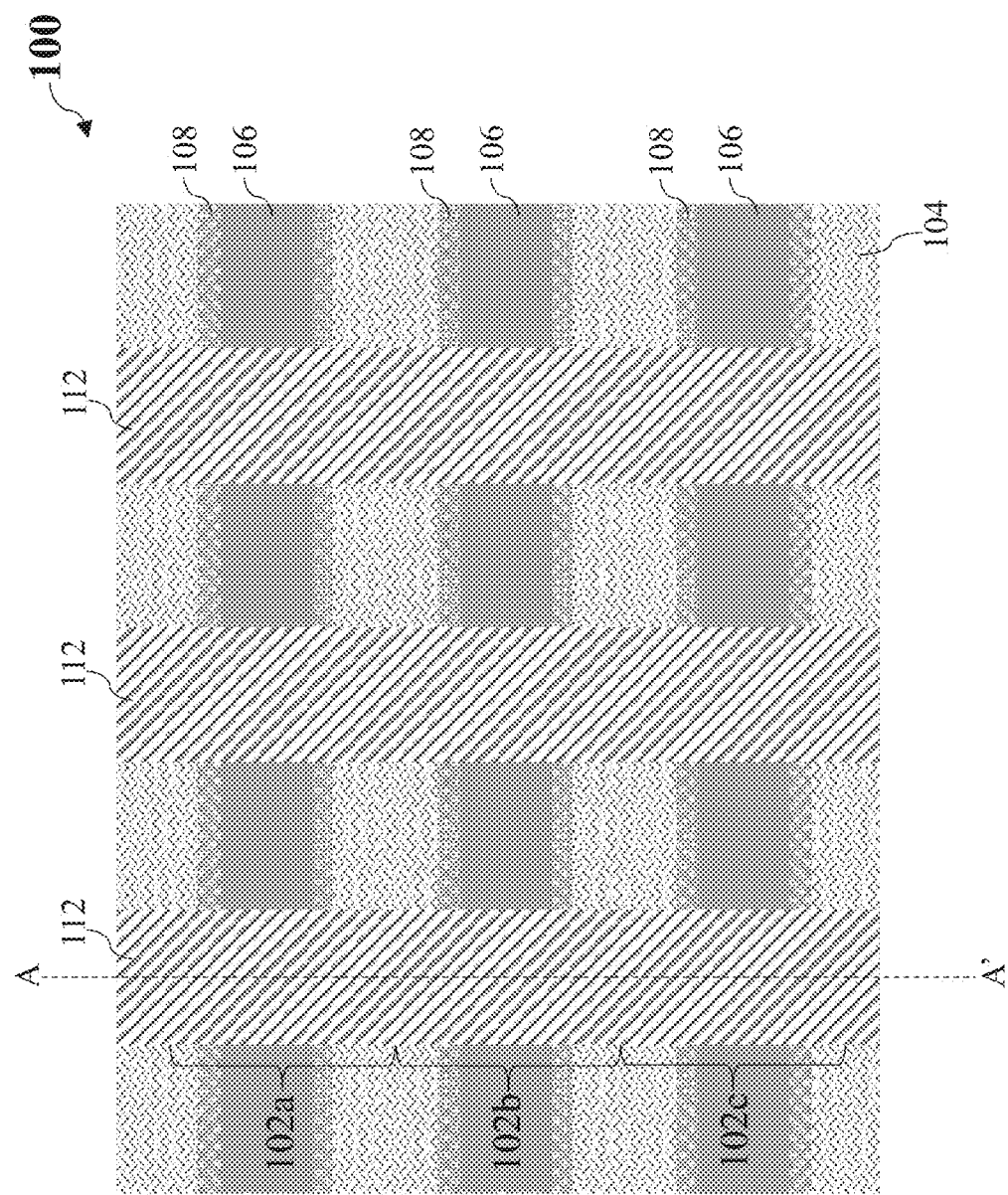
FIGS. 1A and 1B respectively show a simplified top view and a simplified cross-sectional view of a RRAM structure according to various non-limiting embodiments.

The embodiments generally relate to semiconductor devices. More particularly, some embodiments relate to memory devices, for instance, non-volatile memory devices such as RRAM devices in a non-limiting example. The memory devices may be used in several applications, such as, but not limited to, neuromorphic computing applications and multi-bit applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
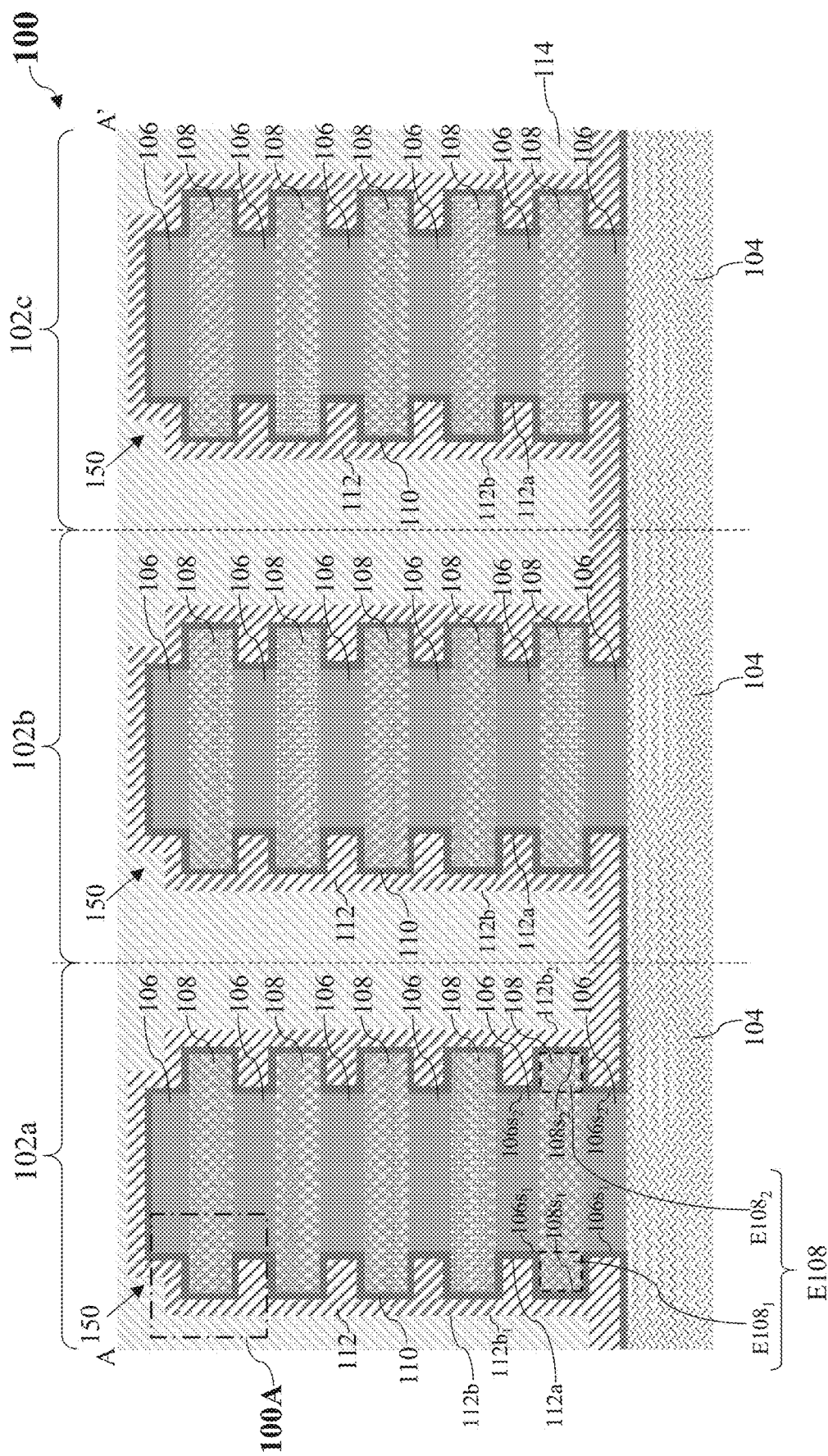

FIG. 1A shows a simplified top view of a RRAM structure 100 according to various non-limiting embodiments, and FIG. 1B shows a simplified cross-sectional view of the RRAM structure 100 along the line A-A' of FIG. 1A. The RRAM structure 100 may be a three-dimensional (3D) structure and may include a matrix of RRAM devices (for example, RRAM devices 102a-102c) similar to each other. Each RRAM device 102a-102c may be a 3D RRAM device. Each RRAM device 102a-102c may be any type of RRAM device, such as, but not limited to, an OxRAM device or a CBRAM device.

Referring to FIG. 1B, each RRAM device 102a-102c of the RRAM structure 100 may include a base layer 104. The base layer 104 of each RRAM device 102a-102c may be an insulating layer and may include insulating material, such as, but not limited to, silicon oxide, silicon dioxide, silicon nitride, or combinations thereof. For example, the base layer 104 may be an inter-layer dielectric (ILD) layer. As shown in FIGS. 1A and 1B, the base layers 104 of the RRAM devices 102a-102c in the RRAM structure 100 may be integrally arranged as a single base layer 104. Although not shown in FIG. 1B, the RRAM structure 100 may further include electrical devices (such as, but not limited to, complementary metal-oxide-semiconductor (CMOS) devices) arranged under the base layers 104 of the RRAM devices 102a-102c.

Each RRAM device 102a-102c may further include a vertical electrode stack 150 arranged over the base layer 104. The vertical electrode stack 150 may include alternating mask elements 106 and first electrodes 108. In particular, each vertical electrode stack 150 may begin with a mask element 106 at its bottom. Further mask elements 106 and first electrodes 108 may be arranged over this mask element 106, such that each first electrode 108 in the vertical electrode stack 150 may be arranged between and may adjoin a pair of mask elements 106. As shown in FIG. 1B, in the vertical electrode stack 150, lengths of the mask elements 106 may be approximately equal. Similarly, lengths of the first electrodes 108 may also be approximately equal. Each mask element 106 may include insulating material, such as, but not limited to silicon oxide, silicon dioxide, silicon nitride, or combinations thereof, and each first electrode 108 may include electrode material such as, but not limited to, ruthenium (Ru), platinum (Pt), titanium nitride (TiN), tantalum nitride (TaN), alloys thereof, or combinations thereof. Each first electrode 108 may be an inert electrode and may serve as a word line (WL).

Referring to FIG. 1B, each mask element 106 may include a first side surface $106s_1$ and a second side surface $106s_2$ opposite to the first side surface $106s_1$. Similarly, each first electrode 108 may include a first side surface $108s_1$ and a second side surface $108s_2$ opposite to the first side surface $108s_1$. Further, each first electrode 108 may include an extended portion E108 extending beyond the first and second side surfaces $106s_1$, $106s_2$ of both the mask elements 106 adjoining the first electrode 108. In particular, the extended portion E108 of each first electrode 108 may include a first extended segment $E108_1$ and a second extended segment $E108_2$ similar to each other. The first extended segment $E108_1$ may extend beyond the first side surface $106s_1$ of the mask elements 106 adjoining the first electrode 108; whereas, the second extended segment $E108_2$ may extend beyond the second side surfaces $106s_2$ of the mask elements 106 adjoining the first electrode 108. As shown in FIG. 1B, in each vertical electrode stack 150, the mask elements 106 may be arranged approximately in a middle of the first electrodes 108. In other words, a length of the first extended segment $E108_1$ may be approximately equal to a length of the second extended segment $E108_2$ in each first electrode 108. However, the mask elements 106 may alternatively be arranged nearer to one of the side surfaces $108s_1$, $108s_2$ of the first electrodes 108, with the lengths of the first and second extended segments $E108_1$, $E108_2$ differing from each other. Note that to avoid cluttering the figure, only the side surfaces $106s_1$, $106s_2$ of two mask elements 106, and only the extended portion E108 (including the first and second extended segments $E108_1$, $E108_2$) and the side surfaces $108s_1$, $108s_2$ of one first electrode 108 are labelled in FIG. 1B.

As shown in FIG. 1B, each RRAM device 102a-102c may further include a switching layer 110 arranged along an outer perimeter of the vertical electrode stack 150. In particular, the switching layer 110 may be arranged along the extended portion E108 (or in other words, the extended segments $E108_1$, $E108_2$) of each first electrode 108 in the vertical electrode stack 150. The switching layer 110 may also be arranged along the first and second side surfaces $106s_1$, $106s_2$ of both the mask elements 106 adjoining the first electrode 108. The switching layers 110 of different RRAM devices 102a-102c may be arranged as an integrated switching layer 110 that may not only extend over the vertical electrode stacks 150 along the outer perimeters of these vertical electrode stacks 150, but may also be arranged over the base layers 104 between the vertical electrode stacks 150 of neighboring RRAM devices 102a-102c. The switching layers 110 may include a resistive switching material, such as, but not limited to, dielectric material. For example, the switching layers 110 may include a transition metal oxide such as hafnium oxide ($HfO_2$), tantalum oxide ($TaO_2$), tantalum pentoxide ($Ta_2O_5$), titanium oxide ($TiO_2$), magnesium oxide (MgO), aluminum oxide ($AlO_2$), silicon dioxide ($SiO_2$) or combinations thereof. The switching layers 110 may also include a chalcogenide based material. Non-limiting examples include Germanium disulfide ($GeS_2$), Germanium telluride (GeTe), Copper sulfide ($Cu_2S$), Silver sulfide ($Ag_2S$) or other suitable chalcogenides.

Each RRAM device 102a-102c may also include a second electrode 112 arranged over the vertical electrode stack 150. The second electrode 112 may include an inner surface 112a in contact with the switching layer 110 and an outer surface 112b opposite to the inner surface 112a. As shown in FIG. 1B, the inner surface 112a may be shaped to follow the switching layer 110, or in other words, the outer perimeter of the vertical electrode stack 150. On the other hand, the outer surface 112b may not be shaped to follow the switching layer 110, but may instead include planar sections $112b_1$, $112b_2$ extending vertically alongside the vertical electrode stack 150. In particular, the second electrode 112 may extend away from the switching layer 110 to form the planar sections $112b_1$, $112b_2$. The second electrodes 112 of different RRAM devices 102a-102c may also be arranged as an integrated second electrode 112 extending over the vertical electrode stacks 150 and between the vertical electrode stacks of neighboring RRAM devices 102a-102c. This integrated second electrode 112 may serve as a bit line (BL). The second electrodes 112 may be active electrodes including electrode material, such as, but not limited to, tantalum (Ta), hafnium (Hf), titanium (Ti), copper (Cu), silver (Ag), cobalt (Co), tungsten (W), alloys thereof or combinations thereof.

Referring to FIG. 1B, the RRAM structure 100 may further include an insulating layer 114 arranged over the base layers 104 of the RRAM devices 102a-102c. The vertical electrode stacks 150, the switching layers 110 and the second electrodes 112 of the RRAM devices 102a-102c may be arranged within the insulating layer 114. The insulating layer 114 may include insulating material, such as, but not limited to flowable dielectrics (for example, spin-on-glass (SOG) compositions). Therefore, the vertical electrode stacks 150 of neighboring RRAM devices 102a-102c may be electrically isolated from each other by the insulating material of the insulating layer 114. For simplicity, the insulating layer 114 is not shown in FIG. 1A.

Figure 2:
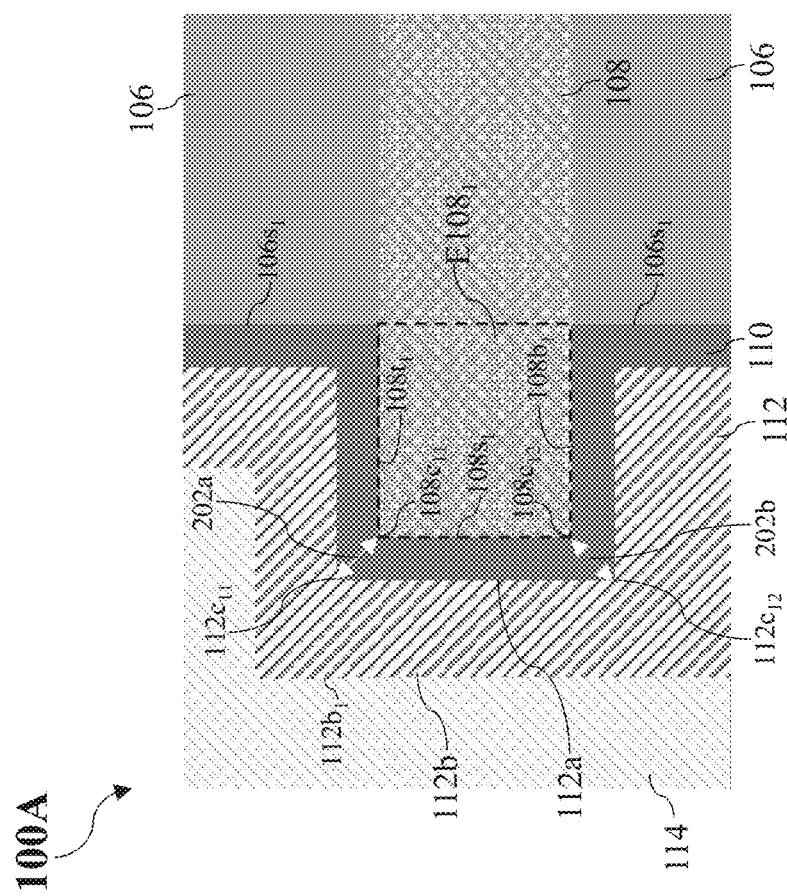
FIG. 2 shows a magnified cross-sectional view of a portion of the RRAM structure of FIGS. 1A and 1B when the RRAM structure is in use.

FIG. 2 shows a magnified cross-sectional view of a portion 100A of the RRAM structure 100, when the RRAM structure 100 is in use. As shown in FIG. 2, each first electrode 108 may be substantially rectangular in shape, with its top and bottom surfaces $108t_1$, $108b_1$ substantially perpendicular to its first side surface $108s_1$. Accordingly, the first electrode 108 may include approximately right-angled top and bottom corners $108c_{11}$, $108c_{12}$. As mentioned above, the second electrode 112 may include an inner surface 112a shaped to follow the outer perimeter of the vertical electrode stack 150. Accordingly, the second electrode 112 may overlap the first electrodes 108, and may thus include approximately right-angled top and bottom corners $112c_{11}$, $112c_{12}$ respectively facing the top and bottom corners $108c_{11}$, $108c_{12}$ of the first electrodes 108. Note that to avoid cluttering the figure, the surfaces $108t_1$, $108b_1$ and corners $108c_{11}$, $108c_{12}$, $112c_{11}$, $112c_{12}$ are not labelled in FIG. 1B.

Referring to FIG. 2, when a set voltage is applied between one of the first electrodes 108 and the second electrode 112, conducting filaments 202a, 202b may be formed within the switching layer 110 between these electrodes 108, 112. Due to the overlap between the first and second electrodes 108, 112, electrical fields at the corners $108c_{11}$, $112c_{11}$, $108c_{12}$, $112c_{12}$ of the electrodes 108, 112 may be enhanced (by about two to three times as compared to other parts of the RRAM device 102a-102c). Therefore, the conducting filaments 202a may be confined between the top corners $108c_{11}$, $112c_{11}$ of the electrodes 108, 112 facing each other; whereas, the conducting filaments 202b may be confined between the bottom corners $108c_{12}$, $112c_{12}$ of the electrodes 108, 112 facing each other. Hence, the variability of the resistance of each RRAM device 102a-102c (especially when the RRAM device 102a-102c is in the HRS) may be reduced. Further, with the above-mentioned enhanced electrical fields, the magnitudes of the set voltage and the reset voltage of each RRAM device 102a-102c of the RRAM structure 100 may be reduced.

FIGS. 3A to 3E show simplified cross-sectional views that illustrate a method for fabricating the RRAM structure 100 according to various non-limiting embodiments. Note that the surfaces $106s_1$, $106s_2$, $108s_1$, $108s_2$, $108t_1$, $108b_1$, 112a, 112b, $112b_1$, $112b_2$, corners $108c_{11}$, $108c_{12}$, $112c_{11}$, $112c_{12}$, and portions/segments E108, $E108_1$, $E108_2$ are not labelled in FIGS. 3A to 3E to avoid cluttering these figures.

As illustrated in FIGS. 3A to 3E, the plurality of RRAM devices 102a-102c of the RRAM structure 100 may be formed simultaneously. Referring to FIGS. 3A to 3C, the method may first include providing the base layers 104 and forming the vertical electrode stacks 150 of the RRAM devices 102a-102c. In particular, as shown in FIG. 3A, the method may include providing the base layers 104 of the RRAM devices 102a-102c as a single base layer 104. The method may then include alternately depositing mask layers 302 and first electrode layers 304 over the single base layer 104. The mask layers 302 may include insulating material and the first electrode layers 304 may include electrode material.

Referring to FIG. 3B, the method may further include etching the mask layers 302 and the first electrode layers 304 to form a plurality of intermediate vertical electrode stacks 306. Each intermediate vertical electrode stack 306 may include alternating first electrodes 108 and intermediate mask members 308.

Referring to FIG. 3C, the method may further include removing portions of the etched mask layers 302, i.e. the intermediate mask members 308 to form the mask elements 106 (therefore, forming the vertical electrode stacks 150 of the RRAM devices 102a-102c). The portions of the intermediate mask members 308 may be removed using any process known to those skilled in the art. For example, a pull-back process may be performed to remove the portions of the intermediate mask members 308.

Referring to FIG. 3D, the method may include depositing switching material over the vertical electrode stacks 150 to form the switching layer 110. The method may further include depositing electrode material over the switching layer 110 to form the second electrode 112.

Referring to FIG. 3E, the method may further include depositing insulating material over the second electrodes 112 to form an intermediate insulating layer. The intermediate insulating layer may then be smoothed using a smoothing process (e.g. a chemical mechanical planarization (CMP) process) to form the insulating layer 114.

The above described order for the method is only intended to be illustrative, and the method is not limited to the above specifically described order unless otherwise specifically stated.

In alternative non-limiting embodiments, the relative arrangement between the mask elements 106 and the first electrodes 108 may be different. However, each first electrode 108 may also include an extended portion E108 extending beyond at least one side surface $106s_1$, $106s_2$ of at least one mask element 106 adjoining the first electrode 108, and the switching layer 110 may also be arranged along the extended portion E108 of each first electrode 108 and along the at least one side surface $106s_1$, $106s_2$ (beyond which the extended portion E108 extends) of the at least one mask element 106 adjoining the first electrode 108.

Figure 4A:
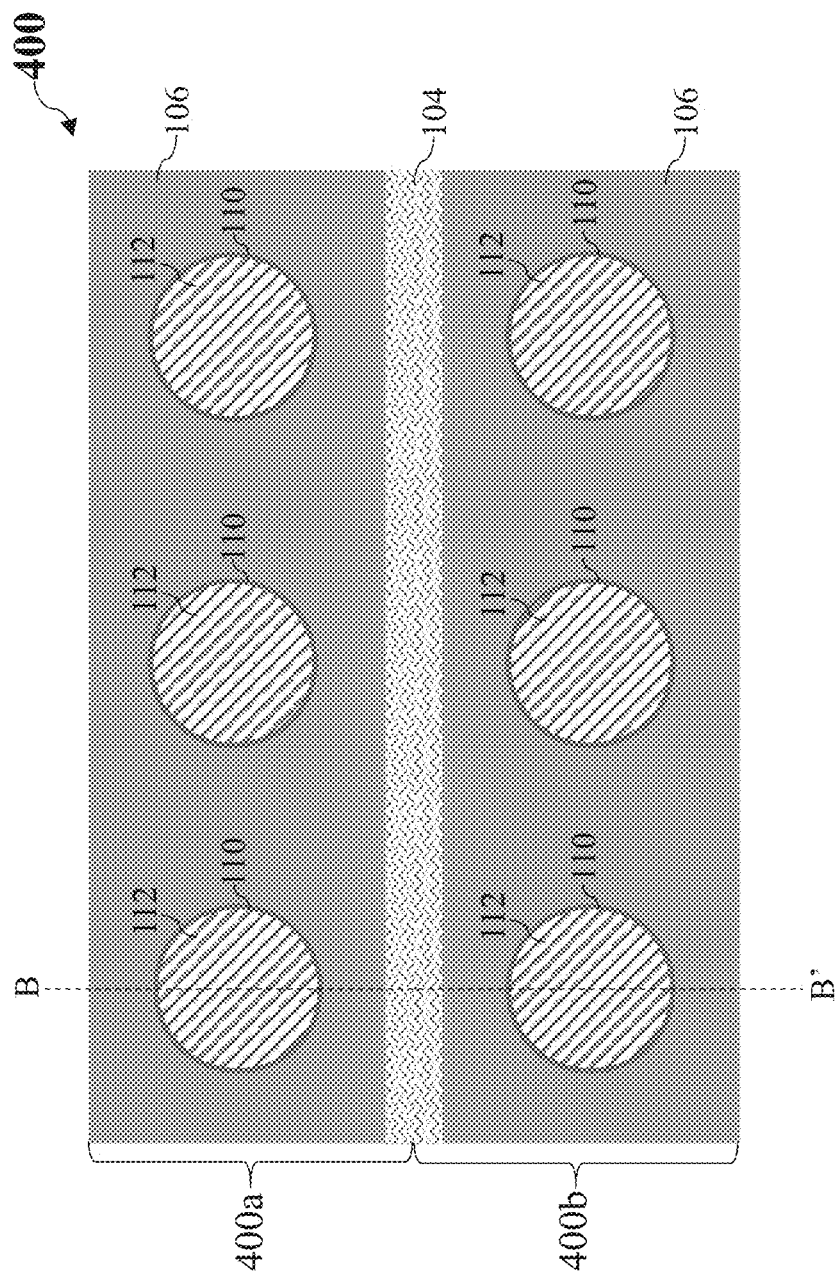
FIGS. 4A and 4B respectively show a simplified top view and a simplified cross-sectional view of a RRAM structure according to alternative non-limiting embodiments.
Figure 4B:
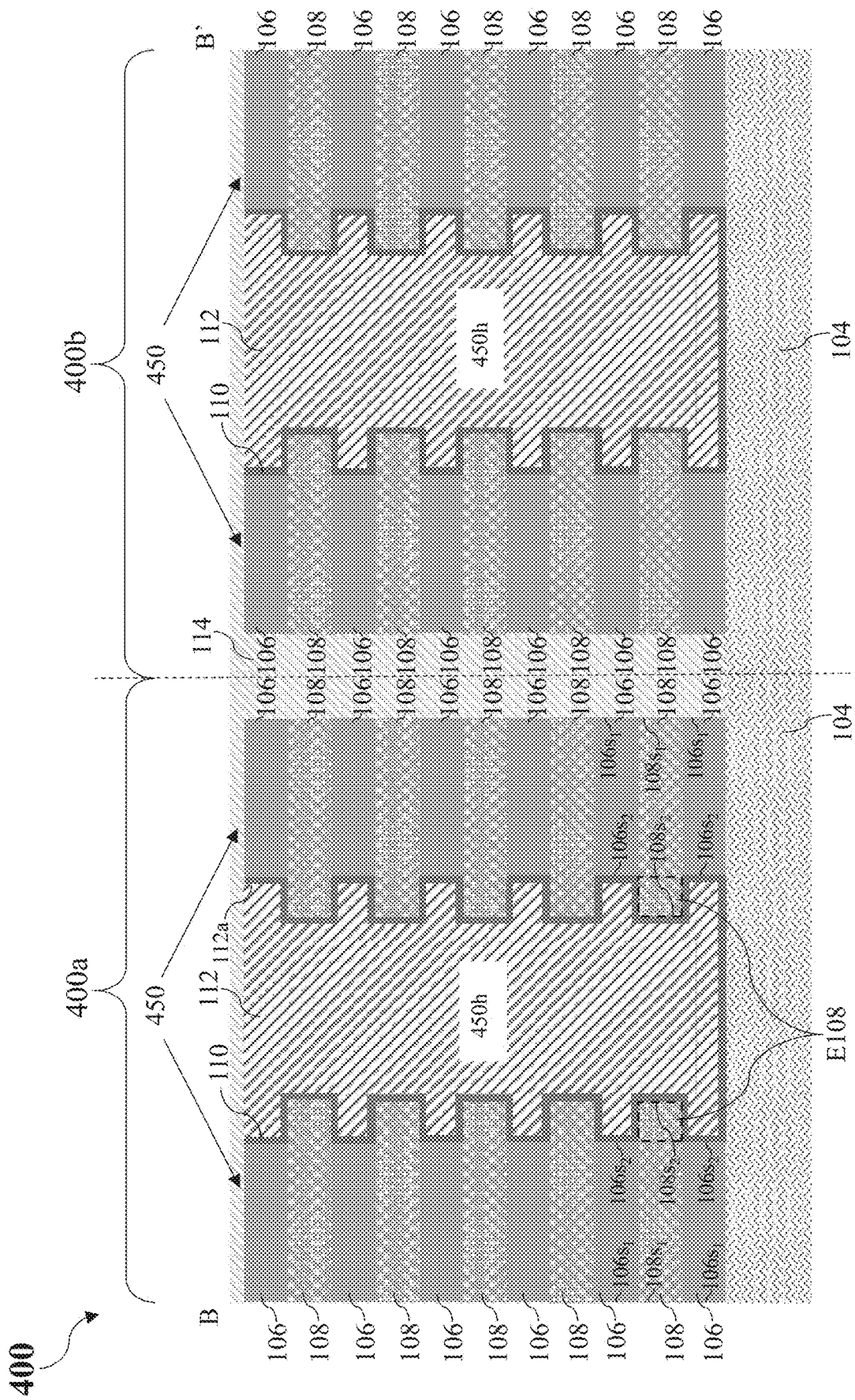

FIG. 4A shows a simplified top view of a RRAM structure 400 according to alternative non-limiting embodiments and FIG. 4B shows a simplified cross-sectional view of the RRAM structure 400 along the line B-B' of FIG. 4A. The RRAM structure 400 may include a plurality of RRAM devices (e.g. RRAM devices 400a, 400b), where each RRAM device 400a, 400b may include a base layer 104 and a vertical electrode stack 450 arranged over the base layer 104. Each vertical electrode stack 450 is similar to the vertical electrode stacks 150 of the RRAM structure 100, and thus the common features are labelled with the same reference numerals and need not be discussed. Again, the insulating layer 114 is not shown in FIG. 4A for simplicity.

Referring to FIG. 4B, the vertical electrode stack 450 of each RRAM device 400a, 400b may also include alternating mask elements 106 and first electrodes 108. Each mask element 106 and each first electrode 108 may include a cylindrical hole and in combination, the cylindrical holes of the mask elements 106 and the cylindrical holes of the first electrodes 108 may form an elongate hole 450h extending vertically through the vertical electrode stack 450. As shown in FIG. 4B, the mask elements 106 and the first electrodes 108 may include first side surfaces $106s_1$, $108s_1$ (outer surfaces) facing away from the elongate hole 450h, and second side surfaces $106s_2$, $108s_2$ (inner surfaces) facing towards the elongate hole 450h. Further, each first electrode 108 may also include an extended portion E108, but unlike the vertical electrode stacks 150 of the RRAM structure 100, the extended portion 108E of each first electrode 108 may extend beyond only one side surface of each mask element 106 adjoining it. In particular, while the first side surface $108s_1$ of each first electrode 108 may be in vertical alignment with the first side surface $106s_1$ of each mask element 106 adjoining it, the extended portion E108 of each first electrode 108 may extend beyond the second side surface $106s_2$ of each mask element 106 adjoining it. Note that to avoid cluttering the figure, only the side surfaces $106s_1$, $106s_2$ of two mask elements 106 and only the side surfaces $108s_1$, $108s_2$ of one first electrode 108 are labelled in FIG. 4B.

In addition, as shown in FIGS. 4A and 4B, each RRAM device 400a, 400b of the RRAM structure 400 may also include a switching layer 110 and a second electrode 112. The switching layer 110 may be arranged within the elongate hole 450h of the vertical electrode stack 450, along an outer perimeter of the vertical electrode stack 450 and over the base layer 104. In particular, the switching layer 110 may be arranged along the extended portion E108 of each first electrode 108 in the stack 450, and along the second side surface $106s_2$ of each mask element 106 adjoining the first electrode 108. The second electrode 112 may also be arranged within the elongate hole 450h of the vertical electrode stack 450, and may be an elongate structure including a surface 112a in contact with the switching layer 110. The surface 112a of the second electrode 112 may be shaped to follow the switching layer 110, and hence, the outer perimeter of the vertical electrode stack 450.

A method for fabricating the RRAM structure 400 may first include alternately depositing mask layers 302 and first electrode layers 304 over a single base layer 104 (similar to the process described above with reference to FIG. 3A). However, instead of forming the intermediate vertical electrode stacks 306, cylindrical holes may be formed through the mask layers 302 and the first electrode layers 304 by etching these layers 302, 304. Portions of the etched mask layers 302 may then be removed to form the vertical electrode stacks 450 with the elongate holes 450h. Switching material may subsequently be deposited into the elongate holes 450h to form the switching layers 110, after which electrode material may be deposited over the vertical electrode stacks 450 and into the elongate holes 450h. Thereafter, electrode material external of the elongate holes 450h may be removed using for example, a chemical mechanical polishing (CMP) process. This may thus form second electrodes 112 arranged entirely within respective elongate holes 450h. Accordingly, the top surfaces of the vertical electrode stacks 450 may be exposed. Insulating material may then be deposited over the vertical electrode stacks 450 to form the insulating layer 114. Each second electrode 112 may thus be electrically isolated from the second electrode 112 of a neighboring RRAM device 400a, 400b by the insulating material of the insulating layer 114.

Figure 5:
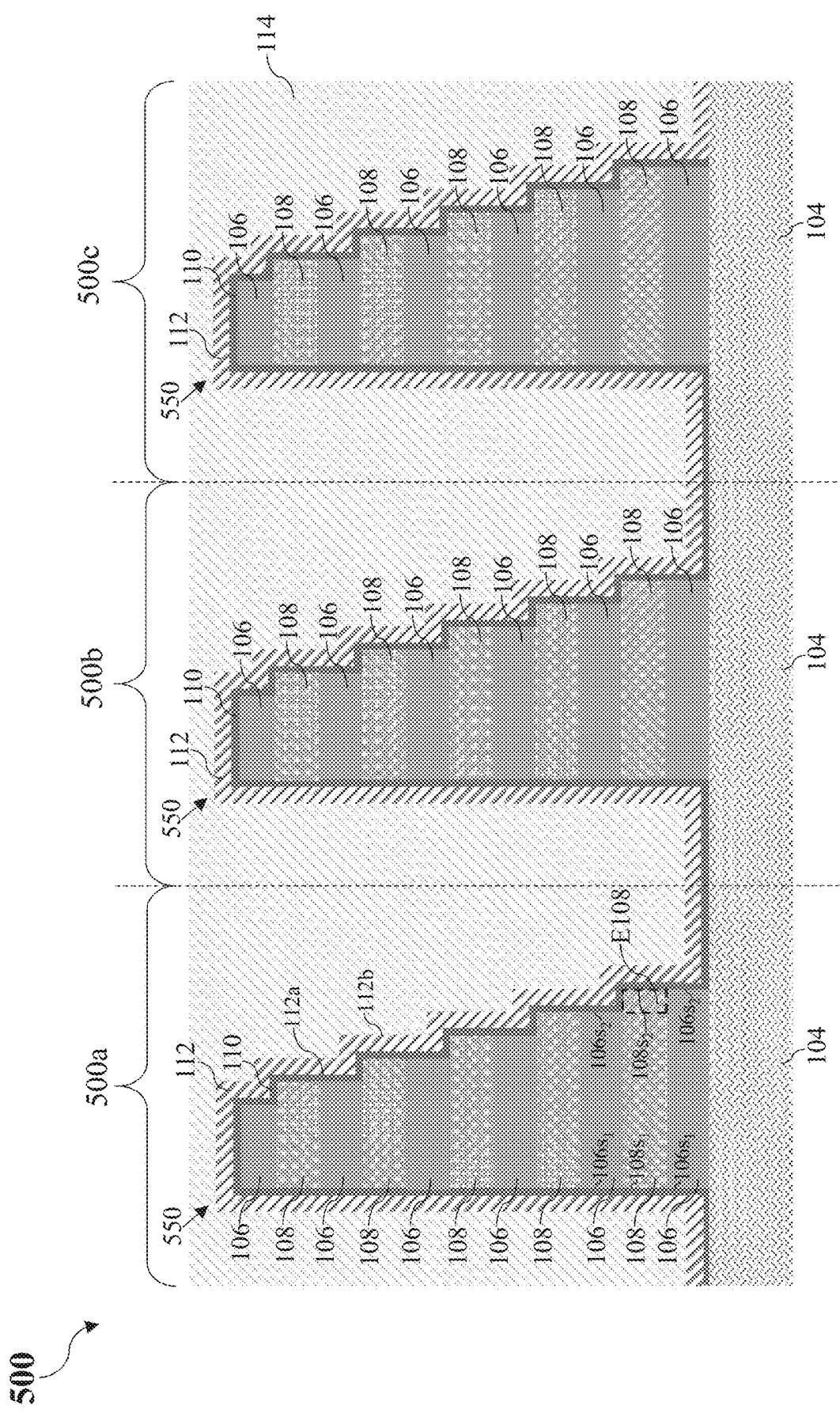
FIG. 5 shows a simplified cross-sectional view of a RRAM structure according to alternative non-limiting embodiments.

FIG. 5 shows a simplified cross-sectional view of a RRAM structure 500 according to alternative non-limiting embodiments. The RRAM structure 500 may include a plurality of RRAM devices 500a, 500b, 500c. As shown in FIG. 5, each RRAM device 500a-500c may similarly include a base layer 104 and a vertical electrode stack 550 arranged over the base layer 104. Each vertical electrode stack 550 is similar to the vertical electrode stacks 150 of the RRAM structure 100, and thus the common features are labelled with the same reference numerals and need not be discussed.

Referring to FIG. 5, each vertical electrode stack 550 of the RRAM structure 500 may also include alternating mask elements 106 and first electrodes 108 with first and second side surfaces $106s_1$, $106s_2$, $108s_1$, $108s_2$. Similar to the RRAM devices 400a-400b in the RRAM structure 400, the first side surface $108s_1$ of each first electrode 108 may be in vertical alignment with the first side surface $106s_1$ of each mask element 106 adjoining it, and each first electrode 108 may include an extended portion E108. As depicted here, the extended portion E108 of each first electrode 108 may extend beyond only one side surface of only one of the adjoining mask elements 106 adjoining the first electrode 108. However, alternatively, each first electrode 108 may extend beyond both side surfaces $106s_1$, $106s_2$ of only one of the adjoining mask elements 106. In particular, as shown in FIG. 5, the extended portion E108 of each first electrode 108 may extend beyond the second side surface $106s_2$ of the mask element 106 arranged above and adjoining the first electrode 108, and the second side surface $108s_2$ of each first electrode 108 may be in vertical alignment with the second side surface $106s_2$ of the mask element 106 arranged under and adjoining the first electrode 108. Accordingly, in each vertical electrode stack 550 of the RRAM structure 500, lengths of the first electrodes 108 may decrease towards a top of the vertical electrode stack 550. Similarly, lengths of the mask elements 106 may also decrease towards a top of the vertical electrode stack 550. Note that although in FIG. 5, the feature of the decreasing lengths of the first electrodes 108 and the mask elements 106 is depicted in conjunction with the feature of the first electrode 108 extending beyond only one adjoining mask element 106, these two features can be used independently of each other.

As shown in FIG. 5, each RRAM device 500a-500c of the RRAM structure 500 may also include a switching layer 110 arranged along an outer perimeter of the vertical electrode stack 550 of the device 500a-500c. In particular, the switching layer 110 may be arranged along the extended portion E108 of each first electrode 108 and along the second side surface $106s_2$ of the mask element 106 beyond which the first electrode 108 extends. Unlike the device 400, the switching layer 110 may also be arranged along the vertically aligned first side surfaces $106s_1$, $108s_1$ of the mask elements 106 and the first electrodes 108. Each RRAM device 500a-500c may further include a second electrode 112 arranged over the vertical electrode stack 550. The second electrode 112 may include an inner surface 112a in contact with the switching layer 110 and shaped to follow the switching layer 110, or in other words, the outer perimeter of the vertical electrode stack 550. The second electrode 112 may also include an outer surface 112b opposite to the inner surface 112a, where the outer surface 112b may similarly be shaped to follow the outer perimeter of the vertical electrode stack 550. As shown in FIG. 5, the second electrodes 112 of different RRAM devices 500a-500c may be arranged as an integrated second electrode 112 extending over the vertical electrode stacks 550 of the RRAM devices 500a-500c, and between the vertical electrode stacks 550 of neighboring RRAM devices 500a-500c. The switching layers 110 of the RRAM devices 500a-500c may also be arranged as an integrated switching layer 110 arranged not only over the vertical electrode stacks 550 along the outer perimeters of these vertical electrode stacks 550, but also over the base layers 104 between the vertical electrode stacks 550 of neighboring RRAM devices 500a-500c.

The RRAM structures 400, 500 may operate in a similar manner as the RRAM structure 100. In particular, when a set voltage is applied between one of the first electrodes 108 and the second electrode 112, conducting filaments may be formed within the switching layer 110 between these electrodes 108, 112. These conducting filaments may similarly be confined between corners of the first and second electrodes 108, 112 facing each other. However, while the conducting filaments of each RRAM device 400a, 400b of the RRAM structure 400 may be formed and confined between both the top and bottom corners of the electrodes 108, 112, the conducting filaments of each RRAM device 500a-500c of the RRAM structure 500 may be formed and confined between only the top corners of the electrodes 108, 112 (since in each RRAM device 500a-500c, the second side surfaces $108s_2$ of the first electrodes 108 may be vertically aligned with the second side surfaces $106s_2$ of the mask elements 106).

FIGS. 6A to 6J show simplified cross-sectional views that illustrate a method for fabricating each vertical electrode stack 550 of the RRAM structure 500.

Each vertical electrode stack 550 may be fabricated by a trim and etch process. In particular, referring to FIG. 6A, the method may first include forming an intermediate vertical electrode stack 606 of alternating intermediate mask elements 602T, 602a-602e and intermediate first electrodes 604a-604e. The intermediate vertical electrode stack 606 may include a top intermediate mask element 602T arranged at its top, first to fifth intermediate mask elements 602a-602e arranged in said order away from the top intermediate mask element 602T, and first to fifth intermediate first electrodes 604a-604e arranged in said order away from the top intermediate mask element 602T. The intermediate vertical electrode stack 606 may be formed in a similar manner as the formation of the intermediate vertical electrode stacks 306 of FIG. 3B described above.

Referring to FIG. 6B, the top intermediate mask element 602T may be trimmed by removing a portion of the mask element 602T (by for example, etching). This may expose a portion of the first intermediate first electrode 604a under the top intermediate mask element 602T.

Referring to FIG. 6C, portions of the first intermediate mask element 602a and the first intermediate first electrode 604a may then be removed. This may be done by etching these intermediate mask element 602a and intermediate first electrode 604a using the top intermediate mask element 602T as a mask.

Referring to FIG. 6D, the top intermediate mask element 602T may be further trimmed to expose another portion of the first intermediate first electrode 604a under it.

Referring to FIG. 6E, portions of the second intermediate mask element 602b and the second intermediate first electrode 604b may be removed by etching them using the first intermediate mask element 602a as a mask. Portions of the first intermediate mask element 602a and the first intermediate first electrode 604a may then be removed by etching them using the top intermediate mask element 602T as a mask.

Referring to FIGS. 6F to 6I, the method may further include repeatedly trimming the top intermediate mask element 602T (as shown in FIGS. 6F and 6H), and etching at least some of the subsequent intermediate mask elements 602a-602d and intermediate first electrodes 604a-604d under it (as shown in FIGS. 6G and 6I). In particular, each time after the top intermediate mask element 602T is trimmed, each subsequent intermediate mask element 602a-602d and the intermediate first electrode 604a-604d above it may be etched together. For each pair of intermediate mask element 602a-602d and intermediate first electrode 604a-604d to be etched together, the etching may be done using the intermediate mask element 602T/602a-602c over and adjoining this pair as a mask.

Referring to FIG. 6J, the top intermediate mask element 602T may be further trimmed to expose a portion of the first intermediate first electrode 604a under it. This trimmed top intermediate mask element 602T, together with the intermediate mask elements 602a-602e and the intermediate first electrodes 604a-604e under it may form one of the vertical electrode stacks 550 of the RRAM structure 500.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A resistive random access memory (RRAM) device comprising:
   a base layer;
   a vertical electrode stack arranged over the base layer, wherein the vertical electrode stack comprises alternating mask elements and first electrodes, wherein each first electrode comprises an extended portion extending beyond at least one side surface of at least one mask element adjoining the first electrode;
   a continuous switching layer arranged along the extended portion of each first electrode and along the at least one side surface of each mask element adjoining the first electrode; and
   a second electrode comprising a surface in contact with the switching layer,
   wherein the vertical electrode stack comprises a lowermost first electrode, an uppermost first electrode, a lowermost mask element and an uppermost mask element of the RRAM device,
   wherein the switching layer is continuous along the vertical electrode stack.

2. The RRAM device of claim 1, wherein the extended portion of each first electrode comprises:
   a first extended segment extending beyond a first side surface of the at least one mask element adjoining the first electrode; and
   a second extended segment extending beyond a second side surface opposite to the first side surface of the at least one mask element adjoining the first electrode.

3. The RRAM device of claim 2, wherein a length of the first extended segment is approximately equal to a length of the second extended segment.

4. The RRAM device of claim 1, wherein in the vertical electrode stack, lengths of the first electrodes are approximately equal, and lengths of the mask elements are approximately equal.

5. The RRAM device of claim 1, wherein the surface of the second electrode in contact with the switching layer is an inner surface, the second electrode further comprises an outer surface opposite to the inner surface, and the outer surface of the second electrode comprises planar sections extending vertically alongside a full vertical length of the vertical electrode stack.

6. The RRAM device of claim 1, wherein the second electrode is arranged over the vertical electrode stack.

7. The RRAM device of claim 1, wherein a first side surface of each first electrode is in vertical alignment with a first side surface of each mask element adjoining the first electrode.

8. The RRAM device of claim 7, wherein the extended portion of each first electrode extends beyond a second side surface of each mask element adjoining the first electrode, wherein the second side surface of each mask element is opposite to the first side surface of the mask element.

9. The RRAM device of claim 1, wherein an elongate hole extends vertically through the vertical electrode stack, and wherein the switching layer and the second electrode are arranged within the elongate hole.

10. The RRAM device of claim 7, wherein the extended portion of each first electrode extends beyond a second side surface of the mask element arranged above and adjoining the first electrode, wherein the second side surface of the mask element is opposite to the first side surface of the mask element.

11. The RRAM device of claim 10, wherein the second side surface of each first electrode is in vertical alignment with the second side surface of the mask element arranged under and adjoining the first electrode.

12. The RRAM device of claim 1, wherein lengths of the first electrodes decrease towards a top of the vertical electrode stack.

13. The RRAM device of claim 1, wherein lengths of the mask elements decrease towards a top of the vertical electrode stack.

14. The RRAM device of claim 1, wherein the RRAM device is a three-dimensional (3D) RRAM device.

15. The RRAM device of claim 1, wherein the switching layer comprises a switching material and the switching layer is arranged continuously along an outer perimeter of the vertical electrode stack,
   wherein the vertical electrode stack comprises a lowermost first electrode arranged over a lowermost mask element and an uppermost mask element arranged over an uppermost first electrode.

16. A three-dimensional (3D) RRAM structure comprising a matrix of RRAM devices, wherein each RRAM device comprises:
   a base layer;
   a vertical electrode stack arranged over the base layer, wherein the vertical electrode stack comprises alternating mask elements and first electrodes, wherein each first electrode comprises an extended portion extending beyond at least one side surface of at least one mask element adjoining the first electrode;
   a continuous switching layer arranged along the extended portion of each first electrode and along the at least one side surface of each mask element adjoining the first electrode; and a second electrode comprising a surface in contact with the switching layer, wherein the vertical electrode stack comprises a lowermost first electrode, an uppermost first electrode, a lowermost mask element and an uppermost mask element of the RRAM device, wherein the switching layer is continuous along the vertical electrode stack.

17. The 3D RRAM structure of claim 16, wherein the second electrodes of the RRAM devices are arranged as an integrated second electrode extending over the vertical electrode stacks of the RRAM devices and between the vertical electrode stacks of neighboring RRAM devices.

18. The 3D RRAM structure of claim 16, wherein the switching layers of the RRAM devices are arranged as an integrated switching layer extending over the vertical electrode stacks of the RRAM devices and over the base layers between the vertical electrode stacks of neighboring RRAM devices.

19. The 3D RRAM structure of claim 16, further comprising electrical devices arranged under the base layers of the RRAM devices.

20. A method of forming a RRAM device, the method comprising:

providing a base layer;

forming a vertical electrode stack over the base layer, wherein the vertical electrode stack comprises alternating mask elements and first electrodes, wherein each first electrode comprises an extended portion extending beyond at least one side surface of at least one mask element adjoining the first electrode;

forming a continuous switching layer along the extended portion of each first electrode and along the at least one side surface of each mask element adjoining the first electrode; and forming a second electrode comprising a surface in contact with the switching layer, wherein the vertical electrode stack comprises a lowermost first electrode, an uppermost first electrode, a lowermost mask element and an uppermost mask element of the RRAM device, wherein the switching layer is continuous along the vertical electrode stack.

* * * * *